(12) United States Patent
Chen et al.

(10) Patent No.: US 7,243,709 B2
(45) Date of Patent: Jul. 17, 2007

(54) HEAT DISSIPATING ASSEMBLY

(75) Inventors: Chin-Ming Chen, Taoyuan Hsien (TW); Chih-Hao Hsia, Taoyuan Hsien (TW); Chun-Yang Hung, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/882,302

(22) Filed: Jul. 2, 2004

(65) Prior Publication Data

US 2005/0224218 A1  Oct. 13, 2005

(30) Foreign Application Priority Data

Apr. 7, 2004 (TW) ............... 93109569 A

(51) Int. Cl.
F28F 7/00 (2006.01)
F24H 3/02 (2006.01)
H05K 7/20 (2006.01)

(52) U.S. Cl. .............. 165/122; 165/121; 165/67; 165/80.3

(58) Field of Classification Search ............ 165/80.3, 165/185, 67, 76–78, 122, 121; 361/695–697, 361/702–704; 257/718–719; 174/16.3; 24/457–458; 248/461, 510
See application file for complete search history.

(56) References Cited

U.S. PATENT DOCUMENTS

| | | | |
|---|---|---|---|
| 5,495,392 A * | 2/1996 | Shen ........................ 361/697 |
| 5,873,406 A * | 2/1999 | Horng ....................... 165/80.3 |
| 6,181,559 B1 * | 1/2001 | Seo ............................ 361/704 |
| 6,226,186 B1 * | 5/2001 | Chien ........................ 361/704 |
| 6,250,375 B1 * | 6/2001 | Lee et al. ................. 165/80.3 |
| 6,362,962 B1 * | 3/2002 | Lee et al. ................... 361/704 |
| 6,362,963 B1 * | 3/2002 | Lee et al. ................... 361/704 |
| 6,404,633 B1 * | 6/2002 | Hsu .......................... 361/703 |
| 6,404,635 B1 * | 6/2002 | Wei ............................ 361/704 |
| 6,415,853 B1 * | 7/2002 | Tao et al. ................. 165/80.3 |
| 6,449,152 B1 * | 9/2002 | Lin ............................ 361/697 |
| 6,450,248 B1 * | 9/2002 | Chang ....................... 165/80.3 |
| 6,477,049 B1 * | 11/2002 | Lin ............................ 361/704 |
| 6,662,412 B2 * | 12/2003 | Chuang et al. ............. 24/457 |
| 6,822,870 B2 * | 11/2004 | Hong et al. ................ 361/704 |
| 2003/0209341 A1 * | 11/2003 | Deboer et al. ............ 165/80.3 |
| 2005/0126753 A1 * | 6/2005 | Lee et al. ................. 165/80.3 |

FOREIGN PATENT DOCUMENTS

| | | |
|---|---|---|
| TW | 345283 | 11/1998 |
| TW | 511733 | 11/2002 |
| TW | 517861 | 1/2003 |
| TW | 537441 | 6/2003 |
| TW | 556872 | 10/2003 |

* cited by examiner

Primary Examiner—Tho Duong
(74) Attorney, Agent, or Firm—Birch, Stewart, Kolasch & Birch, LLP

(57) ABSTRACT

A heat dissipating assembly. The heat dissipating assembly comprises a frame, a clamping member, and a rotatable handle. The frame comprises a locking member. The clamping member is disposed crossing the frame. The rotatable handle is rotatably connected to the frame and abuts the clamping member. The rotatable handle exerts pressure on the clamping member, and the locking member locks the rotatable handle.

18 Claims, 11 Drawing Sheets

HEAT DISSIPATING ASSEMBLY

This Non-provisional application claims priority under 35 U.S.C. § 119(a) on Patent Application No(s). 093109569 filed in Taiwan on Apr. 7, 2004, the entire contents of which are hereby incorporated by reference.

BACKGROUND

The present invention relates to a heat dissipating assembly, and in particular, to a heat dissipating assembly that is easily constructed and provides structural strength.

A conventional heat dissipating assembly as disclosed in Taiwan Patent No. 511,733 provides a dissipating structure mounted on a base, a fan is disposed on a frame and the frame engages to the base such that the dissipating structure is sandwiched therebetween. The fan is disposed directly under the dissipating structure, for efficient heat dissipation.

The frame and the base in the mentioned conventional heat dissipating assembly are connected by a simple mounting structure requiring tools and individual fasteners such that a firm connection is difficult to achieve. Thus, the frame and the base are easily separated, due to vibration induced by fan operation. Further, the connection is skewed and may break after long time use.

SUMMARY

Therefore, an object of the present invention is to provide a heat dissipating assembly that solves the above-mentioned problems. The heat dissipating assembly can be easily constructed without tools, and by eliminating individual fasteners the heat dissipating assembly will not generate noise, vibrate, or break during operation.

The heat dissipating assembly comprises a fan frame, a clamping member, and a rotatable handle. The fan frame comprises a locking member. The clamping member is disposed on the fan frame. The rotatable handle pivots on the fan frame and abuts the clamping member. The rotatable handle exerts pressure on the clamping member, and then the locking member secures the rotatable handle to the fan frame.

The heat dissipating assembly may further comprise a base. The rotatable handle exerts pressure on the clamping member securing the fan frame on the base. When the rotatable handle rotates to a first position, the clamping member exerts pressure on the base, and when the rotatable handle rotates to a second position, pressure is released so that the fan frame is removed from the base.

The base may comprise a protruding arm with an opening in which the clamping member is inserted to connect the fan frame and the base. Further, the clamping member may comprise a hook engaging the opening.

The fan frame may further comprise a connecting channel, the rotatable handle may comprise a through groove, and the clamping member may comprise a first section and a second section. The first section passes through the through groove, and the second section passes through the connecting channel. When the rotatable handle is rotated and abuts the first section, the second section moves with the first section. Further, the rotatable handle comprises a crossbeam and two legs. The legs pivot on the fan frame, the crossbeam connects the legs, and the through grooves are formed in each leg respectively.

The rotatable handle may further comprise an angled portion formed in the legs near the fan frame. The angled portion contacts and abuts the clamping member.

The connecting channel may comprise a first ramp and the second section may comprise a second ramp corresponding to the first ramp. The first and second ramps slide relative to one another when the rotatable handle is rotated, and the second section moves therewith.

The connecting channel may comprise a protrusion and the second section may comprise a sliding guide. The protrusion slides along the sliding guide when the rotatable handle is rotated.

The heat dissipating assembly may further comprise a heat sink connecting to the fan frame. The fan frame may further comprise a fastener for engaging and fixing the dissipating module.

Furthermore, a pattern is formed on the surface of the clamping member, enhancing the strength thereof.

The heat dissipating assembly may further comprise an impeller disposed in the fan frame. The fan frame may further comprise a rib to protect the impeller.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION

Figure 1:
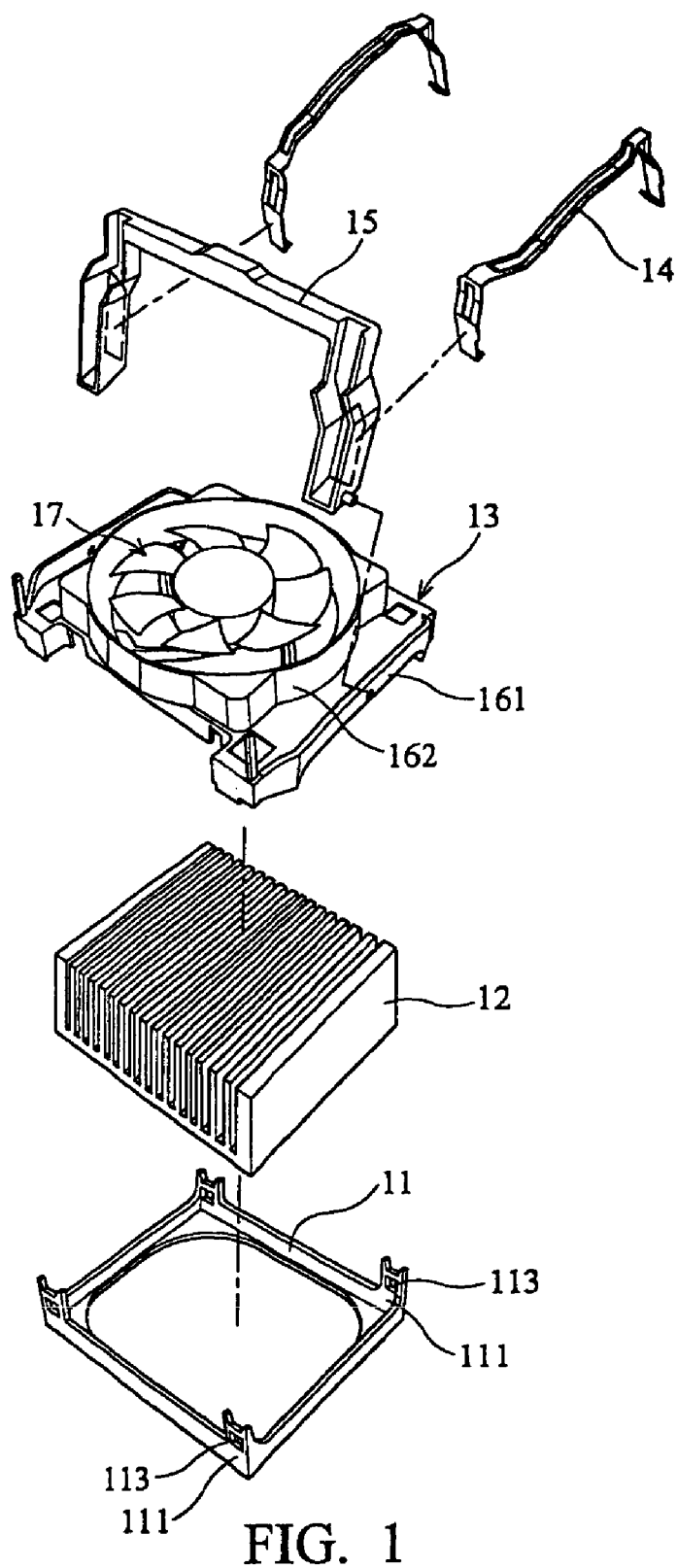
FIG. 1 is an exploded view of a heat dissipating assembly of an embodiment of the present invention.

FIG. 1 shows a heat dissipating assembly of an embodiment of the invention. The heat dissipating assembly comprises a base 11, a heat sink 12, a fan frame 13, a clamping member 14, and a rotatable handle 15. In this embodiment, the heat sink 12 is disposed on the base 11, the fan frame 13 is detachably connected to the base 11, and the heat sink 12 is sandwiched between the base 11 and the fan frame 13. The clamping member 14 is disposed crossing the fan frame 13, and the rotatable handle 15 is rotatably disposed on the fan frame 13 and abuts the clamping member 14. As shown in FIG. 1, the fan frame 13 comprises a main body 161 and a flange 162 projecting from the main body 161, wherein an impeller 17 is surrounded by the flange 162. In this embodiment, the main body 161 and the flange 162 are integrally formed, and the rotatable handle 15 is rotatably disposed on the main body 161.

Figure 2A:
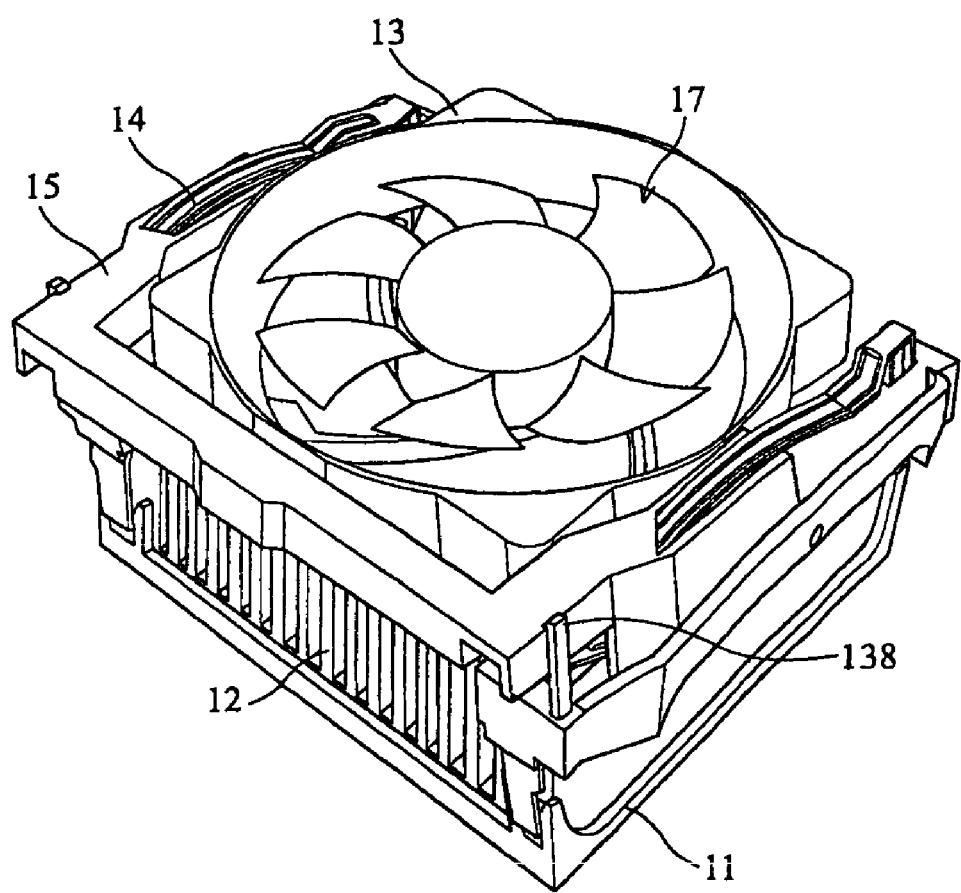
FIG. 2A is a schematic view showing the heat dissipating assembly when a rotatable handle is at a first position.

The assembled heat dissipating assembly is shown in FIG. 2A. When the rotatable handle 15 is rotated, the clamping member 14 moves therewith such that the heat sink 12 is firmly fixed between the base 11 and the fan frame 13. As shown in FIG. 2A, the rotatable handle 15 is in a first position. After the rotatable handle 15 rotates to the first position, a locking member 138 on the fan frame 13 engages and secures the rotatable handle 15. Thus, the rotatable handle 15 maintains steady contact with the fan frame 13 eliminating sway.

Figure 2B:
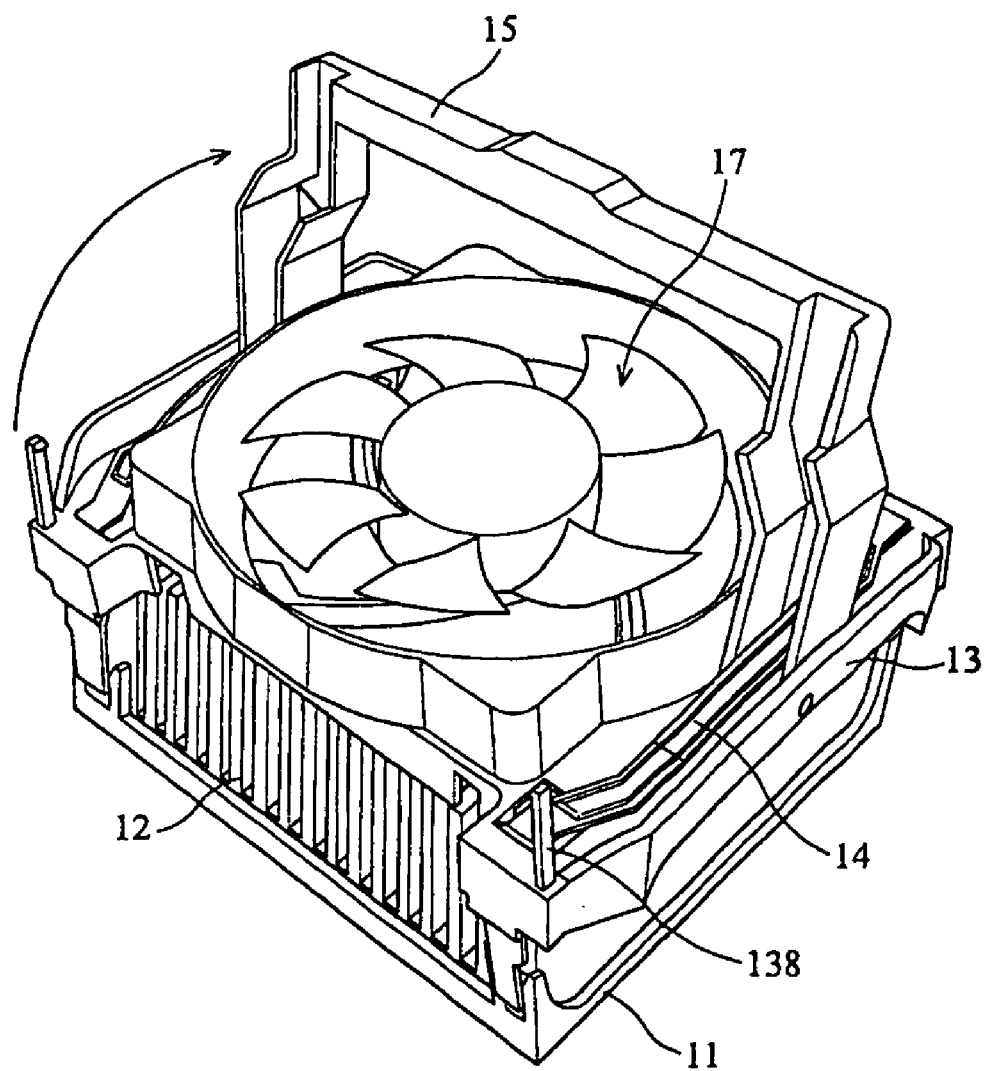
FIG. 2B is schematic view showing the heat dissipating assembly when the rotatable handle is at a second position.
Figure 2C:
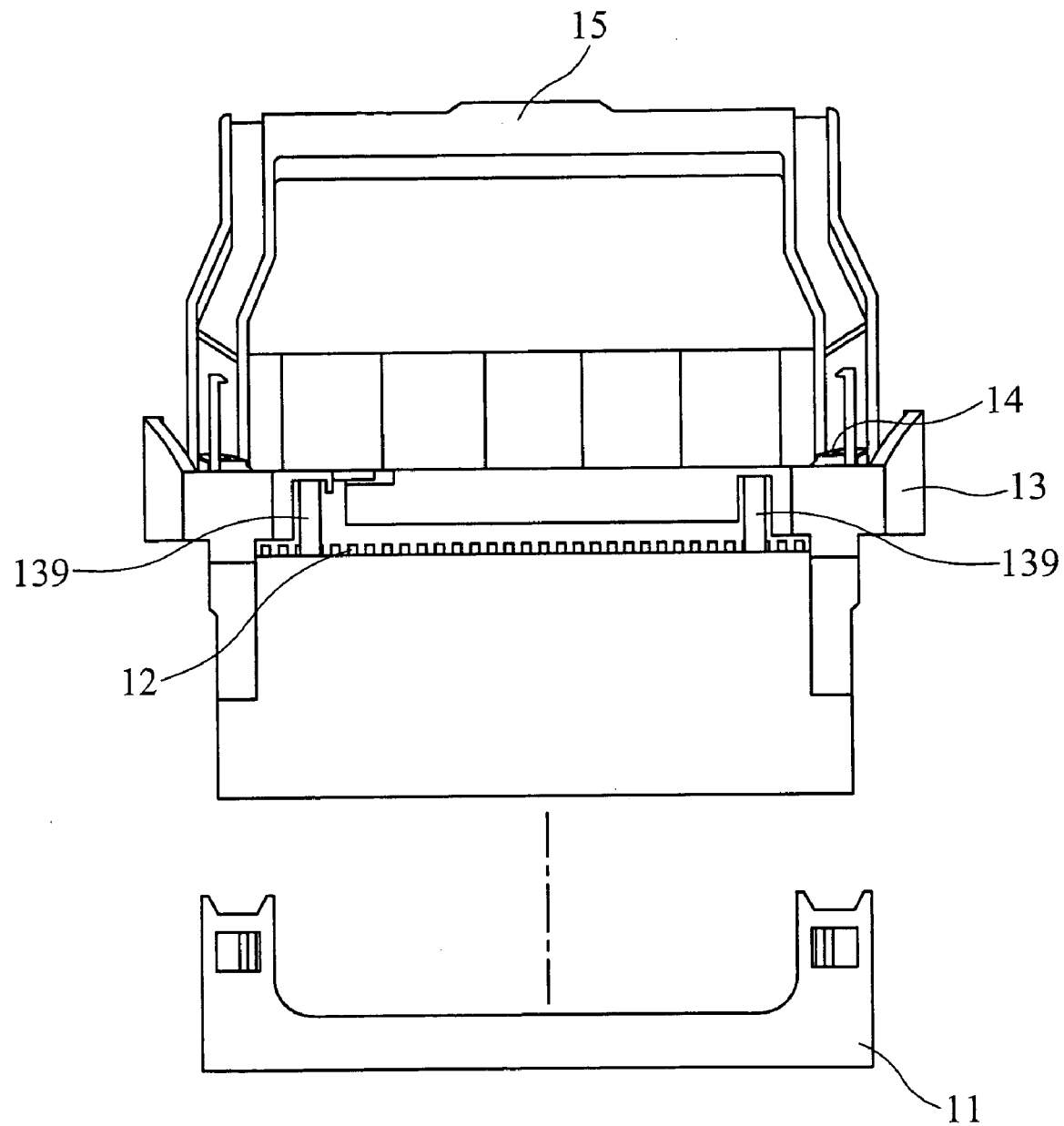
FIG. 2C is a schematic view of the heat dissipating assembly of an embodiment of the present invention.

FIG. 2B shows another schematic view of the heat dissipating assembly of the embodiment of the invention. When the rotatable handle 15 is rotated in the direction indicated by the arrow shown in FIG. 2B, the clamping member 14 releases the base 11. At this point, the rotatable handle 15 is in a second position, and the fan frame 13 can be separated from the base 11 as shown in FIG. 2C.

Figure 3A:
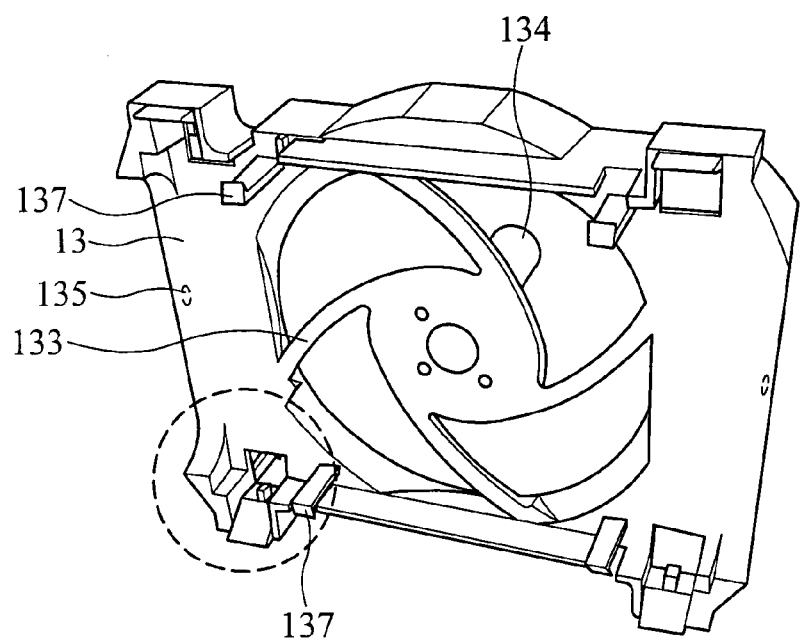
FIG. 3A is a schematic view of a fan frame of the heat dissipating assembly.
Figure 3B:
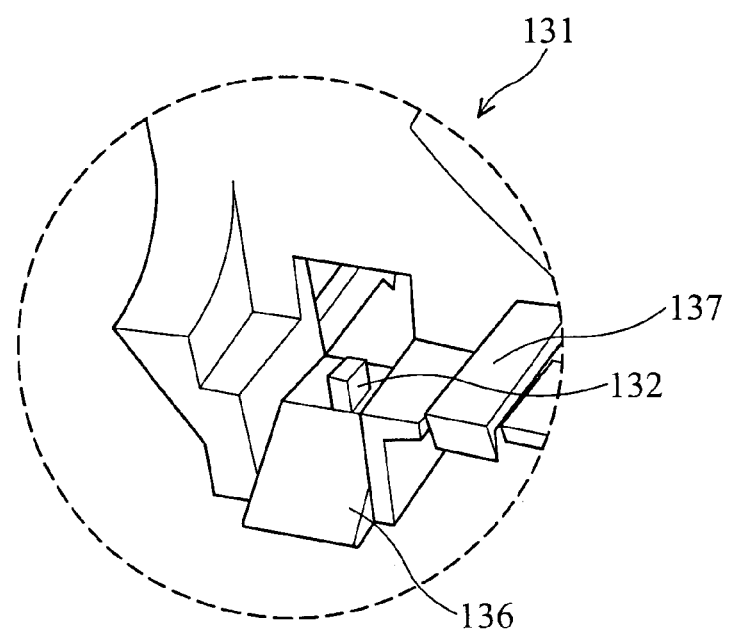
FIG. 3B is a local enlarged view according to FIG. 3A.

FIG. 3A shows the fan frame 13 of the embodiment of the invention. FIG. 3B shows a connecting channel of the fan frame 13. The fan frame 13 comprises a connecting channel 131, ribs 133, a shaft tube 134, two holes 135, and a fastener 137. The connecting channel 131 comprises a protrusion 132 and a first ramp 136. An impeller (not shown) is directly connected to the shaft tube 134 of the fan frame 13. In the embodiment, the fan frame 13 serves as a shield for the impeller. The ribs 133 are formed at the bottom of the fan frame 13 to protect the impeller. The holes 135 are formed in the fan frame 13. The fastener 137 is disposed at the under side of the fan frame 13, engaging the heat sink 12.

Figure 3C:
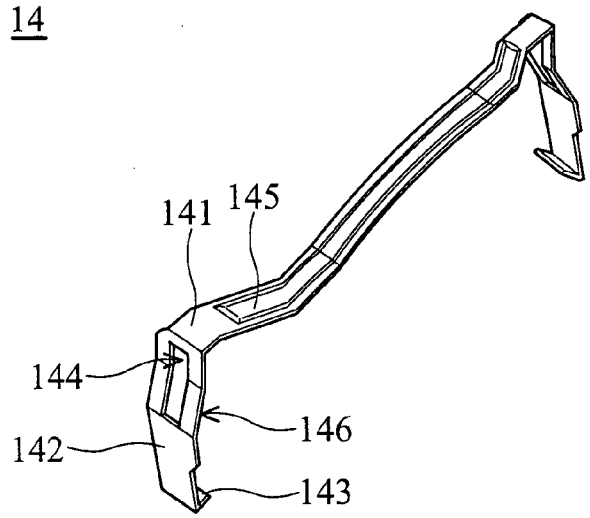
FIG. 3C is a schematic view of a clamping member of the heat dissipating assembly.

FIG. 3C shows the clamping member 14 of the embodiment of the invention. The clamping member 14 comprises a first section 141, a second section 142, a hook 143, a sliding guide 144, an embossed pattern 145, and a second ramp 146. The first section 141 connects to the second section 142. The hook 143 is formed at an end of the second section 142. The sliding guide 144 is formed at the second section 142 near the first section 141. The embossed pattern 145 is formed on the surface of the first section 141, enhancing the strength of the clamping member 141. The second ramp 146 is formed on the second section partly overlapping the sliding guide.

Figure 3D:
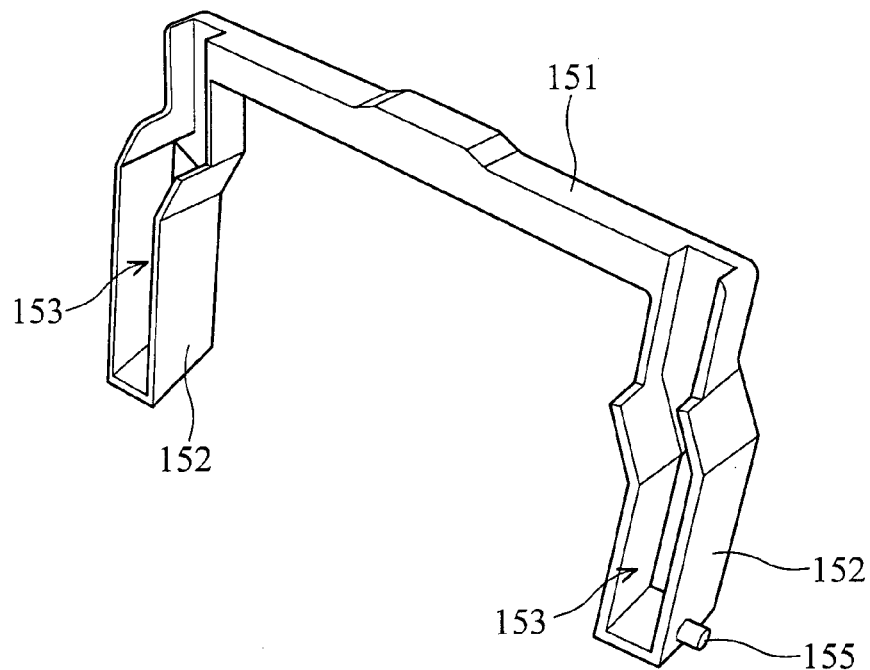
FIG. 3D is a schematic view of the rotatable handle of the heat dissipating assembly.
Figure 3E:
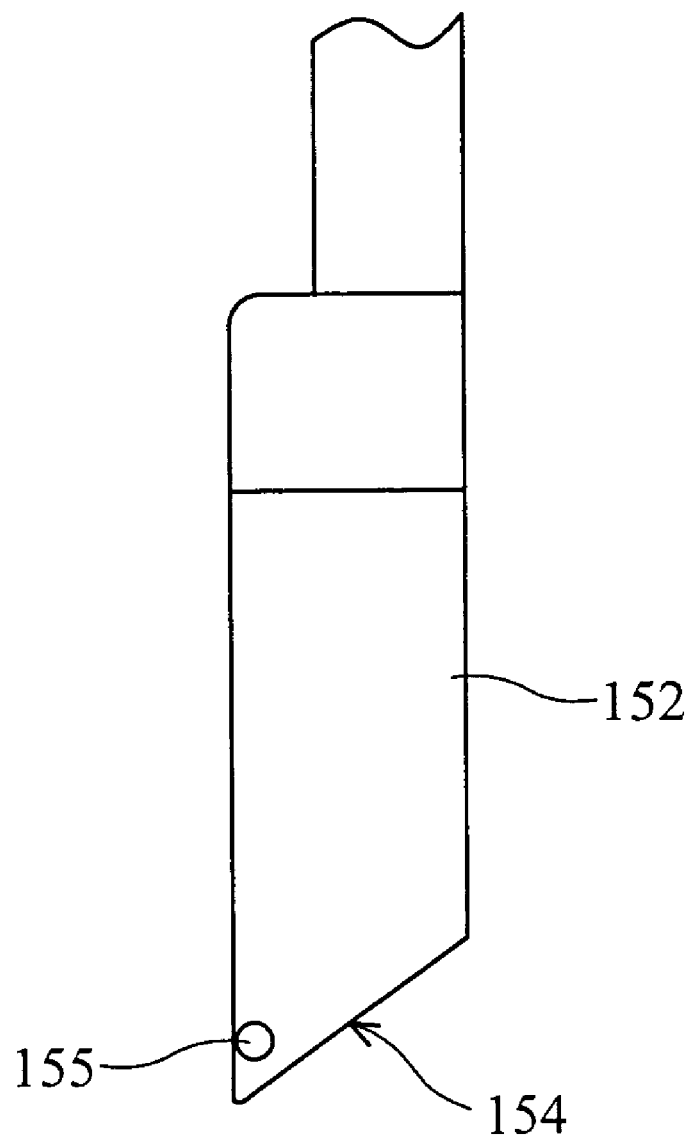
FIG. 3E is a side view of the rotatable handle of the heat dissipating assembly.

FIG. 3D is a schematic view of the rotatable handle 15, and FIG. 3E is a side view thereof. The rotatable handle 15 comprises a crossbeam 151, two legs 152, a through groove 153, an angled portion 154, and a post 155. The post 155 on each leg 152 is inserted in the hole 135 of the fan frame 13 for rotating the rotatable handle 15 on the fan frame 13. The crossbeam 151 connects the legs 152. The through groove 153 is formed on each leg 152. The angled portion 154 is formed on an end of each leg 152 near the fan frame 13.

FIGS. 3A to 3E illustrate the assembly process of the heat dissipating assembly according to the embodiment of the invention. The fastener 137 engages the recess (not shown) on the heat sink 12 to connect the fan frame 13 and the heat sink 12. The post 155 of the rotatable handle 15 passes through the hole 135 of the fan frame 13 so that the rotatable handle 15 can be rotated on the fan frame 13. The first section 141 of the clamping member 14 passes through the through groove 153 of the rotatable handle 15, and the second section 142 of the clamping member 14 passes through the connecting channel 131 of the fan frame 13. The rotatable handle 15 abuts the first section 141 of the clamping member 14. The base 11 is disposed under the heat sink 12. When the rotatable handle 15 is rotated to the first position (as shown in FIG. 2B), the angled portion 154 of the rotatable handle 15 pushes and raises the first section 141 of the clamping member 14, the second section 142 moves therewith, and the hook 143 of the clamping member 14 then engages an opening 113 on a protrusion 111 of the base 11. Therefore, the clamping member 14 exerts pressure on the base 11, and further connects the fan frame 13, the heat sink 12 with the base 11, completing the assembly.

During disassembly of the heat dissipating assembly, the rotatable handle 15 is rotated to the second position (as shown in FIG. 2C), releasing the clamping member 14 from the base 11. Namely, the hook 143 of the clamping 14 separates from the opening 113 of the base 11 so that the fan frame 13 can be separated from the base 11.

Figure 4A:
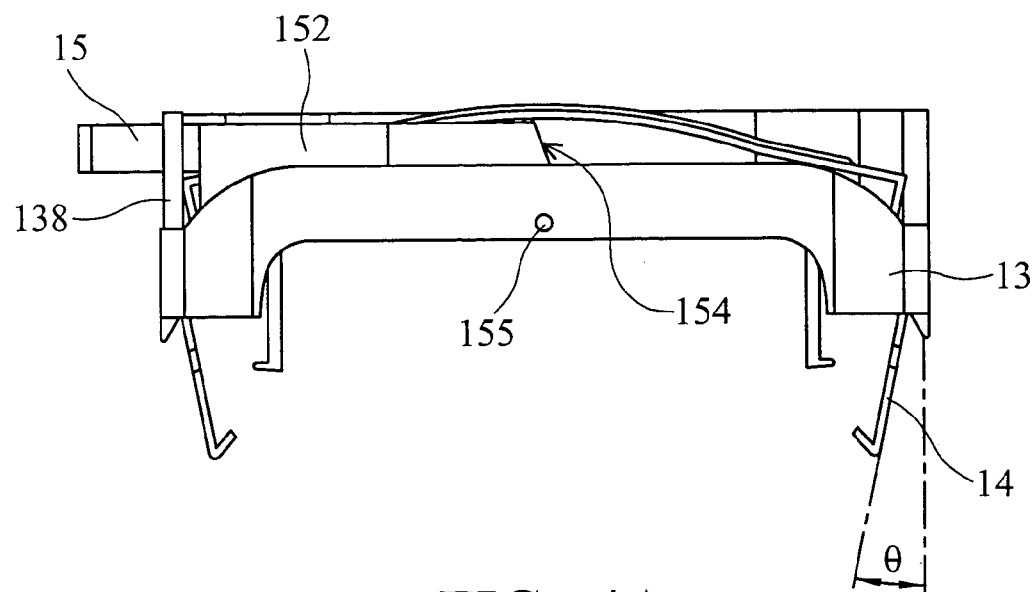
FIG. 4A is a side view of elements of the heat dissipating assembly when the rotatable handle is at the first position.
Figure 4B:
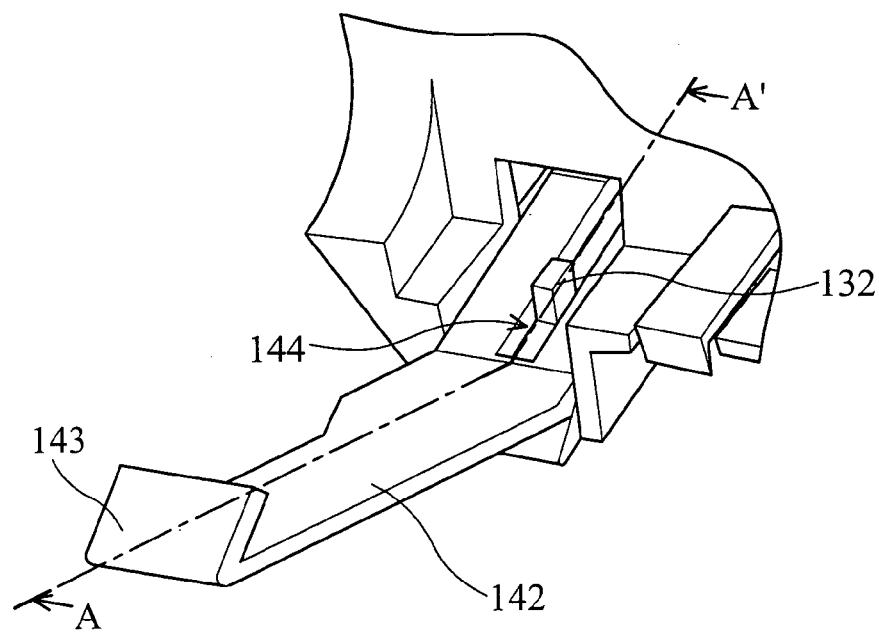
FIG. 4B is a local enlarged view according to FIG. 4A.
Figure 4C:
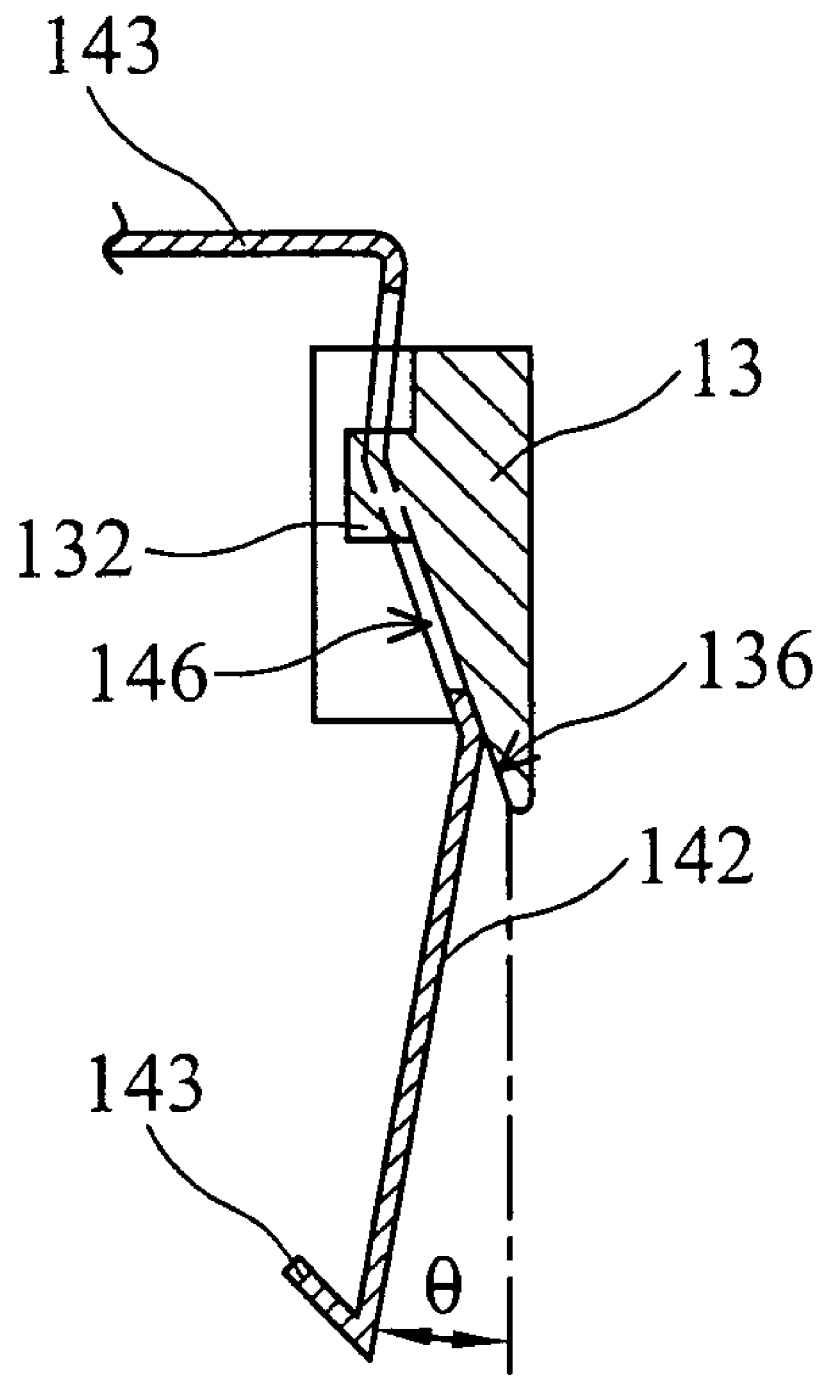
FIG. 4C is a cross section along line A–A' of FIG. 4B.

FIG. 2A and FIGS. 4A to 4C illustrate the clamping member 14 exerting pressure on the base 11. FIG. 4A is a side view of elements of the heat dissipating assembly when the rotatable handle 15 is in the first position. FIG. 4B is a local enlarged view according to FIG. 4A. FIG. 4C is a cross section along line A–A' of FIG. 4B.

The connecting channel 131 of the fan frame 13 comprises the first ramp 136, and the second section 142 of the clamping member 14 has the second ramp 146 corresponding to the first ramp 136. When the rotatable handle 15 is rotated, the first ramp 136 and the second ramp 146 slide relative to one another. Accordingly, when the rotatable handle 15 is rotated to the first position (as shown in FIG. 2B), the first ramp 136 and the second ramp 146 move relatively and abut each other such that the second section 142 moves therewith. Namely, the second section 142 rotates by an angle θ as shown in FIGS. 4A and 4C, and the hook 143 of the clamping member 14 then engages the opening 113 of the base 11 such that the heat sink 12 is fixed between the fan frame 13 and the base 11. Meanwhile, when the rotatable handle 15 rotates to the first position, the locking member 138 locks the rotatable handle 15 to the fan frame 13 preventing movement thereof Subsequent to assembly the heat dissipating assembly is aligned with a heat source to dissipate heat.

Figure 5A:
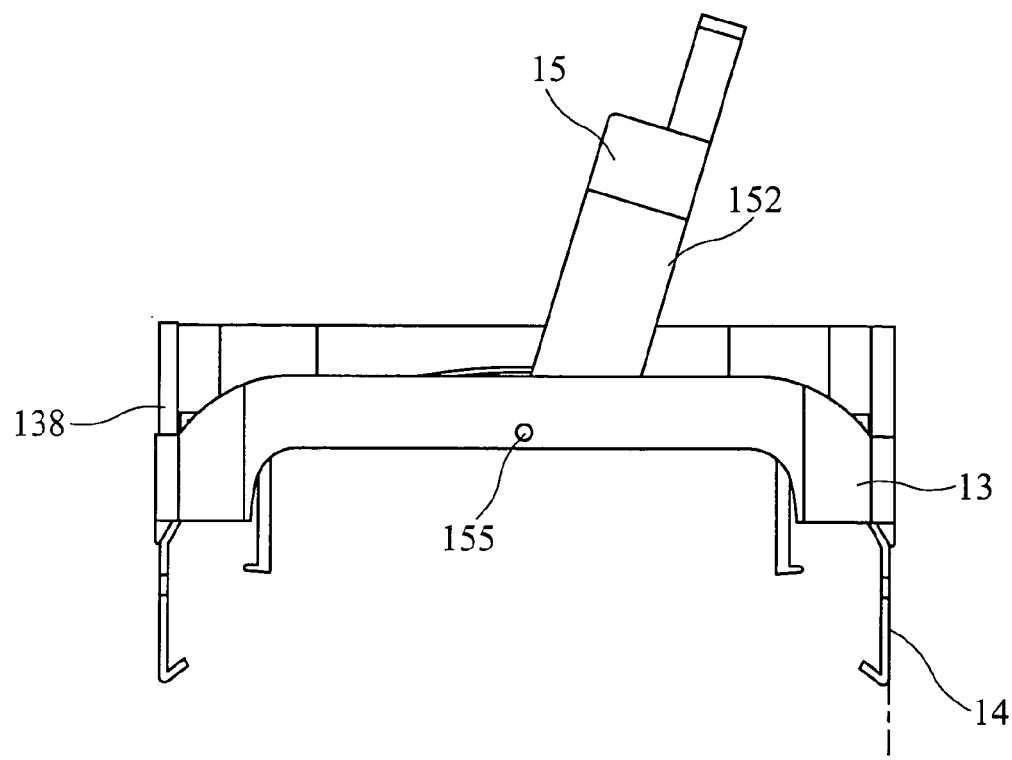
FIG. 5A is a side view of elements of the heat dissipating assembly when the rotatable handle is at the second position.
Figure 5B:
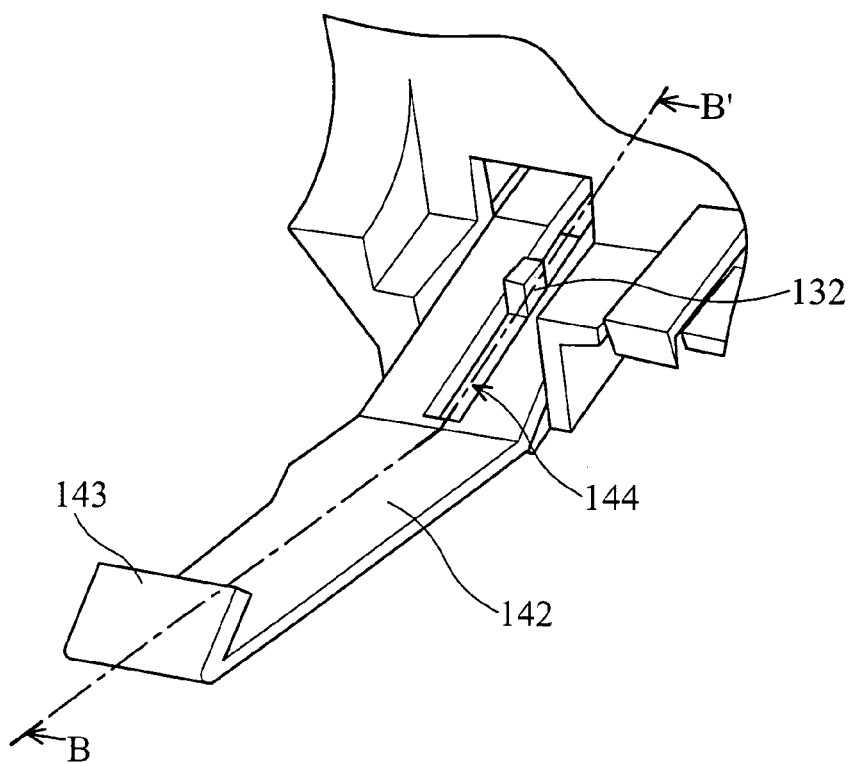
FIG. 5B is a local enlarged view according to FIG. 5A.
Figure 5C:
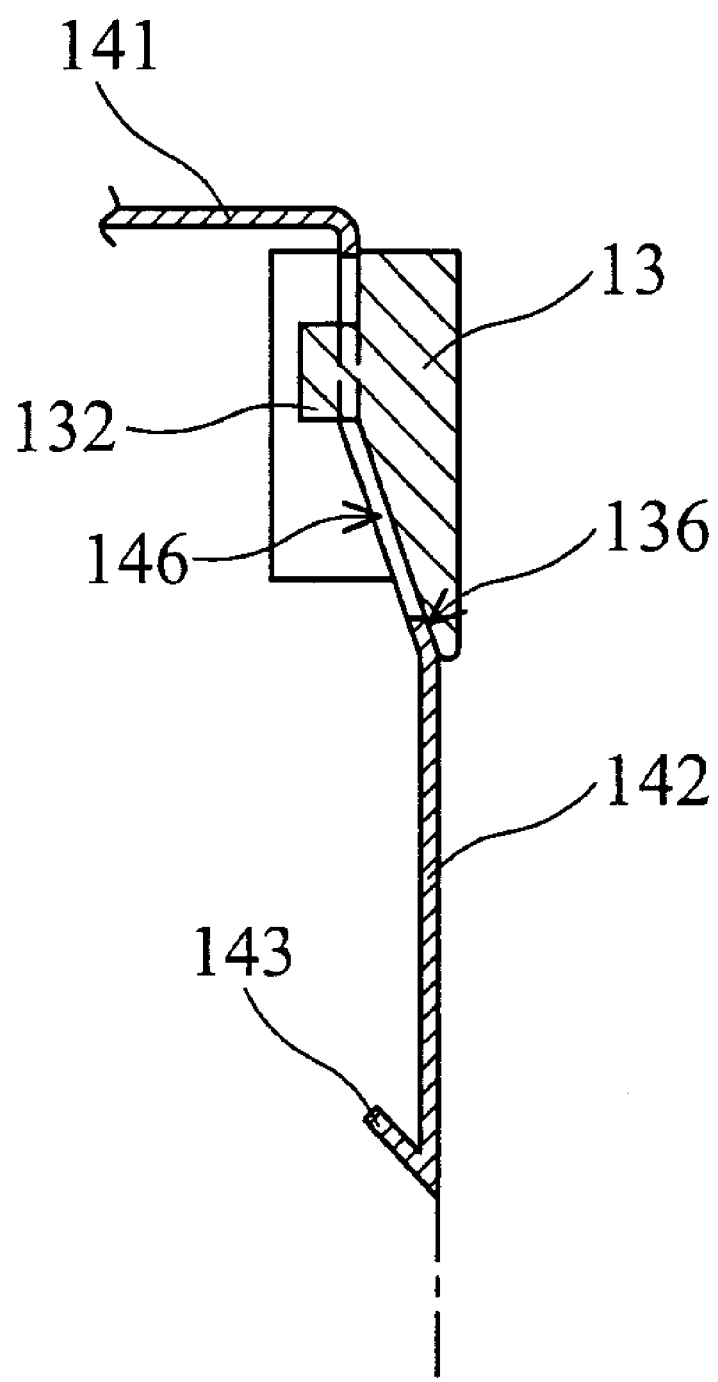
FIG. 5C is a cross section along line A–A' of FIG. 5B.

FIG. 2B and FIGS. 5A to 5C illustrate the clamping member 14 releasing the base 11. FIG. 5A is a side view of the elements of the heat dissipating assembly when the rotatable handle 15 is in the second position. FIG. 5B is a local enlarged view according to FIG. 5A. FIG. 5C is a cross section along line A–A' of FIG. 5B.

When separating the fan frame 13 from the base 11, the rotatable handle 15 is rotated to the second position (as shown in FIG. 2C). The first ramp 136 of the fan frame 13 and the second ramp 146 of the clamping member 14 slide relatively as shown in FIG. 5A and FIG. 5C, releasing the base 11. Namely, the hook 143 of the clamping member 14 disconnects from the opening 113 of the base 11, enabling separation of the fan frame 13 from the base 11.

Furthermore, a protrusion 132 is disposed on the connecting channel 131 of the fan frame 13, and a sliding guide is disposed on the second section 142 of the clamping member 14. When the rotatable handle 15 is rotated, the sliding guide 144 moves with the clamping member 14. The protrusion 132 is disposed in the sliding guide 144. Namely, the protrusion 132 slides along the sliding guide 144 such that the clamping member 14 is not separated from the fan frame 13.

As mentioned above, the advantages of the heat dissipating assembly are as following. The fan frame with an impeller disposed therein can be firmly mounted onto a heat sink without requiring tools or fasteners, thus eliminating noise and vibration, and preventing breakage during the fan operation.

While the invention has been described by way of example and in terms of the preferred embodiments, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipating assembly, comprising:
   a fan frame comprising a locking member and a cylindrical shaft;
   an impeller disposed in the fan frame and rotatable about the cylindrical shaft;
   a clamping member disposed on the fan frame and having an embossed pattern formed on the surface of the clamping member for enhancing the strength thereof; and
   a rotatable handle rotatably connected to the fan frame and abutting the clamping member;
   wherein the rotatable handle exerts pressure on the clamping member, and the locking member secures the rotatable handle to the fan frame.

2. The heat dissipating assembly as claimed in claim 1, further comprising a base, wherein the rotatable handle rotates exerting pressure on the clamping member securing the base.

3. The heat dissipating assembly as claimed in claim 2, wherein when the rotatable handle rotates to a first position, the clamping member secures the base, and when the rotatable handle rotates to a second position, the clamping member releases the base.

4. The heat dissipating assembly as claimed in claim 2, wherein the base comprises a protruding arm with an opening therein, the clamping member is inserted in the opening to connect the fan frame and the base.

5. The heat dissipating assembly as claimed in claim 4, wherein the clamping member comprises a hook engaging the opening to connect the fan frame and the base.

6. The heat dissipating assembly as claimed in claim 1, wherein the fan frame further comprises a connecting channel, the rotatable handle comprises a through groove, and the clamping member comprises a first section and a second section, the first section passes through the through groove, the second section passes through the connecting channel, when the rotatable handle rotates and exerts pressure on the first section, the second section moves therewith.

7. The heat dissipating assembly as claimed in claim 6, wherein the rotatable handle further comprises a crossbeam and two legs, the legs rotate on the fan frame, the crossbeam connects the legs, and the through groove is disposed on each leg.

8. The heat dissipating assembly as claimed in claim 7, wherein the rotatable handle further comprises an angled portion formed on the legs near the fan frame, the angled portion contacts and exerts pressure on the clamping member.

9. The heat dissipating assembly as claimed in claim 6, wherein the connecting channel comprises a first ramp and the second section comprises a second ramp corresponding to the first ramp, the first and second ramps slide relative to one another when the rotatable handle is rotated, and the second section moves therewith.

10. The heat dissipating assembly as claimed in claim 6, wherein the connecting channel comprises a protrusion and the second section comprises a sliding guide, the protrusion slides along the sliding guide when the rotatable handle is rotated.

11. The heat dissipating assembly as claimed in claim 1, further comprising a heat sink connected to the fan frame.

12. The heat dissipating assembly as claimed in claim 11, wherein the fan frame further comprises a fastener for connecting the heat sink.

13. The heat dissipating assembly as claimed in claim 1, wherein the fan frame further comprises a main body and a flange projecting from the main body, wherein the flange is monolithically formed with the main body.

14. The heat dissipating assembly as claimed in claim 1, wherein the fan frame further comprises at least one rib protecting the impeller.

15. The heat dissipating assembly as claimed in claim 1, wherein the clamping member further comprises a first section, a second section, a hook, a sliding guide and a second ramp, the first section connected to the second section, the hook formed at an end of the second section, the sliding guide formed at the second section, the pattern formed on the surface of the first section, and the second ramp formed on the second section.

16. A heat dissipating assembly, comprising:
    a heat sink,
    a fan frame comprising a main body, a flange projecting from the main body, a cylindrical shaft, a locking member and a fastener for connecting the heat sink, wherein the flange is monolithically formed with the main body;
    an impeller disposed in the fan frame and rotatable about the cylindrical shaft;
    a clamping member disposed on the fan frame and having an embossed pattern formed on the surface of the clamping member;
    a rotatable handle rotatably connected to the main body and abutting the clamping member; and
    a base, wherein the rotatable handle exerts pressure on the clamping member securing the base, and the locking member secures the rotatable handle to the fan frame.

17. A heat dissipating assembly, comprising:
    a fan frame comprising a locking member and a cylindrical shaft;
    an impeller disposed in the fan frame and rotatable about the cylindrical shaft;
    a clamping member disposed on the fan frame; and
    a rotatable handle rotatably connected to the fan frame and abutting the clamping member;
    wherein the rotatable handle exerts pressure on the clamping member, and the locking member secures the rotatable handle to the fan frame;
    wherein the clamping member comprises a first section, a second section, a hook, a sliding guide, an embossed pattern, and a second ramp, the first section is connected to the second section, the hook is formed at an end of the second section, the sliding guide is formed at the second section, the embossed pattern is formed on the surface of the first section, and the second ramp is formed on the second section.

18. A heat dissipating assembly, comprising:
    a fan frame comprising a locking member and cylindrical shaft;
    an impeller disposed in the fan frame and rotatable about the cylindrical shaft;

a clamping member disposed on the fan frame and having an embossed pattern formed on the surface of the clamping member; and a rotatable handle rotatably connected to the fan frame and abutting the clamping member;

wherein the rotatable handle exerts pressure on the clamping member, and the locking member secures the rotatable handle to the fan frame;

wherein the fan frame further comprises a connecting channel, the rotatable handle comprises a through groove, and the clamping member comprises a first section and a second section, the first section passes through the through groove, and the second section passes through the connecting channel, when the rotatable handle rotates and exerts pressure on the first section and the second section moves therewith;

wherein the connecting channel comprises a protrusion and the second section comprises a sliding guide, the protrusion slides along the sliding guide when the rotatable handle is rotated.

* * * * *